(12) United States Patent
Rebstock et al.

(10) Patent No.: US 12,550,667 B2
(45) Date of Patent: Feb. 10, 2026

(54) METHOD AND SYSTEM FOR INSPECTION OF AN INNER POD OR AN OUTER POD OF AN EUV POD

(71) Applicant: BROOKS AUTOMATION (GERMANY) GMBH, Steiβlingen (DE)

(72) Inventors: Lutz Rebstock, Gaienhofen (DE); Ulrich Quarti, Constance (DE); Tobias Forstner, Steiβlingen (DE)

(73) Assignee: BROOKS AUTOMATION (GERMANY) GMBH (DE)

( * ) Notice: Subject to any disclaimer, the term of this patent is extended or adjusted under 35 U.S.C. 154(b) by 340 days.

(21) Appl. No.: 18/253,798

(22) PCT Filed: Nov. 17, 2021

(86) PCT No.: PCT/EP2021/082015
§ 371 (c)(1),
(2) Date: May 22, 2023

(87) PCT Pub. No.: WO2022/106482
PCT Pub. Date: May 27, 2022

(65) Prior Publication Data
US 2024/0006210 A1  Jan. 4, 2024

(30) Foreign Application Priority Data
Nov. 23, 2020 (EP) ...................... 20209306

(51) Int. Cl.
*H01L 21/67* (2006.01)
*G01N 21/88* (2006.01)
(Continued)

(52) U.S. Cl.
CPC ... *H01L 21/67288* (2013.01); *G01N 21/8851* (2013.01); *G03F 1/66* (2013.01); *G03F 7/70916* (2013.01); *H01L 21/67359* (2013.01)

(58) Field of Classification Search
CPC ........ H01L 21/67288; H01L 21/67359; G01N 21/8851; G03F 1/66; G03F 7/70916
See application file for complete search history.

(56) References Cited

U.S. PATENT DOCUMENTS 10,831,115 B1   11/2020   Moon et al.
2005/0175217 A1*   8/2005   Mueller .................... G06T 7/73
                                                              382/103

(Continued)

FOREIGN PATENT DOCUMENTS

JP   2008058133       3/2008
JP   2016085188 A    5/2016
(Continued)

OTHER PUBLICATIONS

International Search Report for application PCT/EP2021/082015 dated Feb. 23, 2022.

*Primary Examiner* — Jamil Ahmed
(74) *Attorney, Agent, or Firm* — Perman & Green, LLP (57) ABSTRACT

Method for inspection of an inner pod EIP and/or an outer pod EOP of an EUV pod, respectively including a base member and a cover member. The method includes acquiring inspection data sets using a line scan camera and an area scan camera, inspecting the cover member in a first inspection unit using the line scan camera, inspecting the base member in a second inspection unit using the area scan camera, inspecting the cover member in the second inspection unit using the area scan camera, and inspecting the base member in the first inspection unit using the line scan camera.

15 Claims, 5 Drawing Sheets

(51) Int. Cl.
*G03F 1/66* (2012.01)
*G03F 7/00* (2006.01)
*H01L 21/673* (2006.01)

(56) References Cited

U.S. PATENT DOCUMENTS

| | | |
|---|---|---|
| 2010/0074514 A1 | 3/2010 | Hayashi et al. |
| 2015/0370179 A1 | 12/2015 | Suzuki |
| 2020/0158661 A1 | 5/2020 | Wendel |
| 2020/0203201 A1 | 6/2020 | Wendel |

FOREIGN PATENT DOCUMENTS

| | | |
|---|---|---|
| JP | 2016194434 A | 11/2016 |
| WO | 2012153662 | 11/2012 |

\* cited by examiner

METHOD AND SYSTEM FOR INSPECTION OF AN INNER POD OR AN OUTER POD OF AN EUV POD

CROSS-REFERENCE TO RELATED APPLICATIONS

This application is a National Stage of International Application No. PCT/EP2021/082015 having an International Filing Date of 17 Nov. 2021, which designated the United States of America, and which International Application was published under PCT Article 21(2) as WO Publication No. 2022/106482 A1, which claims priority from and the benefit of European Patent Application No. 20209306.8, filed on 23 Nov. 2020, the disclosures of which are incorporated herein by reference in their entireties.

BACKGROUND

Field

The present disclosure relates to a method and a system for inspection of an inner pod or an outer pod of an EUV pod.

Brief Description of Related Developments

Lithography for semi-conductor manufacturing is constantly changing to shorter wavelengths in order to be able to achieve smaller features. At present, wavelengths in the extreme UV, so called EUV, are being implemented more and more. The development of special EUV masks (reticles) for EUV lithography is by now well researched and developed.

EUV lithography is extremely sensitive to contamination. Thus, for storing and transporting reticles, so called EUV pods are utilized, which comprise two pods, namely an inner pod EIP which is placed inside an outer pod EOP. A reticle, which is stored and transported within the EIP of an EUV pod is thus protected against contamination present in the out side atmosphere. However, contamination caused by abrasion due to relative movement of the reticle relative to the EUV pod or due to relative movement of different parts of the pod relative to one another must also be avoided. Typically, an EUV pod is opaque to deep ultraviolet (DUV) radiation.

A reticle to be stored or transported is secured within the inner pod EIP, so that movement of the reticle within the inner pod is avoided, thus minimising or completely avoiding any abrasion effects, which could lead to contamination of the reticle. Likewise, the inner pod EIP is secured within the outer pod EOP of the EUV pod, thus also minimising or avoiding potentially contaminating abrasion effects.

In order to ensure safe and clean handling of reticles at all times, EUV pods have to be inspected for contamination as well as defects such as scratches or material fatigue for example at regular intervals, or after a certain amount of handling operations or cycles.

SUMMARY

The present disclosure provides a method for inspection of an inner pod EIP or an outer pod EOP of an EUV pod, as well as a corresponding inspection station.

According to a first aspect, the disclosure provides a method for inspection of an inner pod EIP and/or an outer pod EOP of an EUV pod, respectively including a base member and a cover member, the method comprising acquiring inspection data using a line scan camera and an area scan camera, comprising the following steps:

1. Inspecting the cover member in a first inspection unit using the at least one line scan camera,
2. Inspecting the base member in a second inspection unit using the at least one area scan camera,
3. Inspecting the cover member in the second inspection station using the at least one area scan camera, and
4. Inspecting the base member in the first inspection station using the at least one line scan camera.

Be it noted that in the technical field concerned, base members and cover members of an EIP are usually referred to simply as base and cover respectively, whereas base and cover members of an EOP are referred to as carrier door and carrier shell respectively. In this specification, the terms base member and cover member are usually used in connection with both EIP and EOP.

The disclosure provides a reliable way of monitoring the state of an EIP or an EOP with high inspection rates. In the following, the term EUV pod component will in some instances be used to designate the base member and/or the cover member of either an EIP or an EOP.

Advantageously, steps 1 and 2 are performed at least in part simultaneously, followed by steps 3 and 4 being performed at least in part simultaneously, or steps 3 and 4 are performed at least in part simultaneously, followed by steps 1 and 2 being performed at least in part simultaneously.

According to a preferred aspect, steps 1 and 4 comprise positioning and/or moving the cover member and the base member respectively by means of a 3- or 4-axis table.

Such a table comprises a table member, which is displaceable along three orthogonal axes, and rotatable about at least one of these axes by means of a 3-axis or 4-axis mechanism. Thus, the table member of a 3-axis table can especially be accurately positioned within a 3-dimensional space, defined for example by two orthogonal horizontal axes, referred to as x-axis and y-axis in the following, and a vertical axis, orthogonal to the x-axis and the y-axis, referred to as z-axis in the following. Furthermore, in case of a 4-axis table, the table member can be rotated about one of these axes, typically the z-axis Such a table enables exact and reproducible positioning, so that for example comparisons between inspection data taken at different times can be more easily used to ascertain the occurrence of defects or ageing or deterioration effects.

Also, exact positioning of the table member is particularly advantageous in connection with line scan cameras, which have a very short or small depth of field, also referred to as depth of focus or focal length. Line scan cameras are configured to build up an image, one line at a time, using a line sensor which passes in a linear motion over an object, or where the object passes in a linear motion under the sensor. In the context of the present disclosure, it is preferable that the line scan camera is fixed in space, such that the position of the focal area (or focal line) is precisely determined. This effect can be utilized for calibration or exact positioning of the table member, as will be explained further below.

Be it noted that it is also conceivable to perform steps 1 and 4, i.e. positioning and/or moving the cover member and/or the base member by means of any other suitable device, such as a handling robot, for example comprising a moveable gripper, with which the necessary exactness of position can be achieved. It is also possible to maintain the base member and/or the cover member in a fixed or an essentially fixed position and achieve the necessary positioning or moving of the cover member and/or the base member relative to the line scan camera by means of movement of the camera. In this case, the camera is advantageously provided with a positioning device, by means of which sufficiently exact positioning of the camera can be achieved.

Advantageously, steps 2 and 3 comprise positioning and/or moving the base member and the cover member respectively by means of a 3- or 4-axis-table or by means of a handling robot. Here also, it is possible to maintain the base member and/or the cover member in a fixed or an essentially fixed position and achieve the necessary positioning or moving of the cover member and/or the base member relative to the line scan camera by means of movement of the camera.

Especially in connection with an area scan, an inspection can be performed at a faster rate if the EUV pod components are moved by means of handling robot. Under certain circumstances it is, however, preferred to move the EUV pod components relative to both the line scan camera(s) and the area scan camera(s) by means of 3- or 4-axis tables, as this minimizes abrasion effects and particle generation, which can lead to contamination of the EUV pod components.

Preferably, using the at least one line scan camera and using the at least one area scan camera comprises darkfield imaging and bright light imaging. By using these two imaging techniques, a large array of defects and contaminations can be detected. For example, by means of darkfield imaging, scratches on the surface an EUV pod component are reliably detectable, while contamination particles on a surface of an EUV pod component are readily detectable by bright light imaging.

It is especially preferred to perform darkfield imaging and bright light imaging simultaneously by means of the at least one line scan camera and/or the at least one area scan camera, the darkfield imaging utilizing illumination at a first wavelength and bright light imaging using illumination at a second wavelength different from the first wavelength. Hereby, the inspection rate can be significantly enhanced over prior art solutions, in which darkfield and bright light imaging is performed successively.

Advantageously, a weight measurement of the EUV pod to be inspected, especially of the EIP, is performed prior to steps 1 to 4. This provides an easy and reliable way of ascertaining whether a reticle is still present in the EUV pod, especially within the EIP. For example, opening an EIP still containing a reticle by the handling robot of an inspection station could easily cause damage or contamination to a reticle. In addition to a weight measurement, typically performed by means of a weight measuring unit, a means for identification of the EUV pod, especially the EIP, is provided. By identifying the type of EUV pod being weighed, and combining this information with the weight as measured, it can be reliably determined whether or not there is a reticle within the EUV pod, especially within the EIP. Preferred means for identifying the EUV pod include a 2D matrix reading of the EUV pod, or the usage of an RFID provided on the EUV pod. The 2D matrix reading can especially comprise reading a barcode, such as a 2D barcode, provided on the EUV pod.

It is also advantageous to perform a surface particle counting adapted to count particles on a surface of an EUV pod component, especially the cover member and/or the base member.

In addition or alternatively hereto, counting airborne particles within an atmosphere around the EUV pod component to be inspected, especially the cover member and/or the base member is advantageous.

According to a preferred aspect of the disclosure, inspection data are acquired at different times, for example after each usage cycle of the EUV pod, these sets of inspection data being compared to one another (i.e., inspection data of an EUV pod or an EUV pod component being compared to at least a set of previously acquired corresponding inspection data) and/or to a standard. This provides a reliable method of monitoring deterioration of the EUV pod or of EUV components over time.

Advantageously, steps 1 and 4 can comprise inspecting the cover member and the base member using a plurality of line scan cameras respectively configured and adapted to capture a scan line or a plurality of scan lines on different surfaces of the cover member or the base member, wherein for inspection the cover member or the base member respectively is placed on a table member of a 3-axis or 4-axis table, for which at least one reference position relative to a corresponding one of the plurality of line scan cameras has been determined as follows:

capturing a scan line on at least one surface by means of a respective one of the plurality of line scan cameras, in case the scan line captured by the line scan camera is not in focus, moving the table member relative to the line scan camera such that the scan line comes into focus determining the position of the table member, at which the scan line is in focus, as reference position of the table member relative to the line scan camera on an axis extending parallel to an optical axis of line scan camera and/or on an axis extending parallel to the scan line.

As mentioned above, positioning and relative movement of the line scan camera or the plurality of line scan cameras relative to the table member can also be achieved by moving the line scan camera, and maintaining the table member in a fixed position.

Advantageously, markings are provided on the surfaces of the 3-axis or 4-axis table, which are adapted to facilitate focusing of the line scan cameras and/or image capture.

Hereby, a highly reliable and exacting method for determining for example one, two or more reference positions of a table member of a 3-axis or a 4-axis table relative to one, two or more line scan cameras is provided. For example, the first line scan camera is arranged vertically above the table member, such that its optical axis extends essentially at a right angle to the horizontally extending main or upper surface of the table member (i.e. along the z-axis as defined above), such that it can capture the surface or any edges, markings or other expedient images provided on the main surface. A second line scan camera is advantageously arranged such that its optical axis extends essentially horizontally (i.e. along the x-axis or y-axis as defined above), and can capture the second surface, especially a side surface of the table member, or edges, markings or images provided thereon adapted to facilitate focusing and/or imaging. As will be further explained below, an exact calibration or determination of position of the table member relative to all three axes is readily achievable using two line scan cameras, as will be explained below.

As the depth of field, i.e. the distance between the nearest and furthest points from the line scan camera which are in acceptably sharp focus, is very small for line scan cameras, and the positions of individual in focus pixel images are precisely known, this enables a very precise determination of reference positions for the table member. This exact determination of reference positions enhances comparability of images of EUV components obtained with different detection units of the same type, which in practice are tolerance affected. Thus, for example, different images of one and the same EUV component taken at different times during its lifetime by different detection units can be better compared to one another, thus improving evaluation of a state of an EUV component. Hereby, for example, unnecessary and premature sorting out or discarding of EUV components can be minimised or avoided.

The present disclosure also provides an inspection station adapted for inspection of an inner pod EIP and/or an outer pod EOP of an EUV pod, respectively comprising a base member and a cover member, the inspection station comprising an inspection module with at least two inspection units and an image data acquisition unit for acquiring EUV pod inspection data sets, the data acquisition unit comprising at least one line scan camera and at least one area scan camera, wherein the image data acquisition unit is adapted to:
  inspect the cover member in the first inspection unit using the at least one line scan camera,
  inspect the base member in the second inspection unit using the at least one area scan camera,
  inspect the cover member in the second inspection unit using the at least one area scan camera, and
  inspect the base member in the first inspection unit using the at least one line scan camera.

The inspection station advantageously comprises at least one inspection unit comprising a 3-axis- or a 4-axis table adapted to position and move the base member and/or the cover member relative to the data acquisition unit.

Preferably, the inspection station further comprises a load port module adapted to receive an EUV pod, i.e. an EIP arranged and secured within an EOP. The load port module is also adapted to open the EOP in order to access the EIP. For example, the load port module separates the base member (carrier door) of the EOP, together with the complete EIP, from the cover member (carrier shell) of the EOP. After this separation, the EIP is opened, i.e. separated into base member (base) and cover member (cover). These EIP components can then be further handled by means of a handling module, as will be explained below, while the EOP components remain in the load port module. It would also be possible to perform an inspection of the EOP components especially while the EIP components are being inspected.

The load port module is preferably provided with a means for identifying and/or weighing the EIP before it is opened, in order to determine whether or not it still contains a reticle. In case it is determined that the EIP still contains a reticle, it will usually be expedient to reassemble the complete EUV pod, and transport it to a unit adapted for removal of the reticle from the EUV pod.

Expediently, the inspection station further comprises a handling module comprising a handling robot adapted to transfer the cover member and/or the base member of the EIP or the EOP from the load port module to the inspection module and vice versa.

According to a preferred aspect of the inspection station, the at least one line scan camera and/or the at least one area scan camera is provided with bright light and darkfield illumination means adapted to enable simultaneous bright light and darkfield imaging of a cover member or a base member. Simultaneous bright light and darkfield imaging provides a substantially improved throughput for an inspection station compared to prior art solutions.

The disclosure further provides a method of determining at least one reference position of a table member of a 3-axis or a 4-axis table relative to at least one of a plurality of line scan cameras, comprising the following steps:
  capturing a scan line on at least one surface of the table member by means of a respective one of the plurality of line scan cameras,
  in case the scan line captured by the line scan camera is not in focus, moving the table member relative to the line scan camera such that the scan line comes into focus
  determining the position of the table member, at which the scan line is in focus, as a reference position of the table member relative the line scan camera on an axis extending parallel to an optical axis of the line scan camera and/or on an axis extending parallel to the scan line.

Hereby, a highly reliable and exacting method for determining one, two or more reference positions of a table member of a 3-axis or a 4-axis table relative to one, two or more line scan cameras is provided. Especially, a first line scan camera of the plurality of line scan cameras is arranged vertically above the table member, such that its optical axis extends essentially in a vertical direction, referred to as z-direction or z-axis in the following, or in a nearly vertical direction, and at a right angle (or at an angle within a range of for example 10 degrees from a right angle) to the horizontally extending main surface of the table member, such that it can capture the main or upper surface, especially an edge of the main surface or any markings or other expedient images provided on the main surface.

The position of the line scan camera is advantageously fixed in space, for example on a frame, such that by moving the table member vertically, i.e. along the z-axis, the upper surface can be brought into focus. As the focus length of a line scan camera is typically very short, the position of the table member relative to the z-axis can be determined precisely. Be it noted that as the line scan cameras as used in the present disclosure are preferably fixed in space, and their depth of focus is very short, it is, especially after a few trial runs, possible to immediately position a surface of the table member to be captured within the depth of focus of the line scan camera. Hereby, time consuming imaging at different positions of the table member relative to the line scan camera to determine the depth of focus can be avoided.

At the same time, as the exact positions of the individual pixel images of the scan line of the line scan camera at focus length or within the focus line of the line scan camera are known, the position of the table member relative to a horizontally extending axis, i.e. extending vertically to the optical axis of the first line scan camera or within the plane of the main surface of the table member, can be precisely determined. For example, in case the scan line crosses an edge of the main surface of the table member, there will be two neighbouring pixels within the line sensor of the line scan camera, one of which will capture an image (pixel image) of the edge of the main surface of the table member, which will be in focus, while the other one of which will capture an image of the surroundings or background of the table member, which will not be in focus. If, for example, the extension direction of the scan line of the line scan camera is referred to as the x-direction or x-axis, the position of these two pixels precisely defines the position of the table member relative to this x-axis. A correspondingly precise determination of the position of the table member along this x-axis can be obtained by imaging patterns provided on the main surface of the table member.

In an analogous manner, if a second line scan camera is provided, the optical axis of which extends in a horizontal direction, for example along an axis perpendicular to the x-axis, for example the y-axis as defined above, such that its line sensor and a corresponding scan line extends along the z-axis as defined above, the table member can be moved in y-direction until a side surface of the table member comes into the focus length of the second line camera. Again, as outlined above, the exact position of the table member in y-direction can thus be determined.

At the same time, by correspondingly analysing imaging information of individual pixels as also outlined above, the position of the table member in z-direction can be determined of confirmed.

All in all, by effecting only two line scans in the manner as outlined above, the exact position of the table member in three dimensions can be determined.

It would also be possible to determine the exact position of the table member by means of three line scan cameras, the optical axes of which extend along the x, y and z-axis respectively. Alternatively, the first line scan camera, the optical axis of which extends in z-direction, could be rotated about the z-axis, such that its line sensor during capture of a first image of the main surface of the table member extends in x-direction, and then subsequently, during capture of a second image of the main surface of the table member, in y-direction.

As already mentioned above, the depth of field, i.e. the distance between the nearest and furthest points from the line scan camera which are in acceptably sharp focus, is very small for line scan cameras, this enables a very precise determination of reference positions for the table member. This exact determination of reference positions allows effective calibration of inspection units, and thus especially enhances comparability of scans or images of EUV components obtained with different detection units of the same type, which in practice are tolerance affected. Thus, for example, images of one and the same EUV component taken at different times during its lifetime by different detection units can be better compared to one another, thus improving evaluation of a state of an EUV component. Hereby, for example, unnecessary and premature sorting out or discarding of EUV components can be minimised or avoided.

BRIEF DESCRIPTION OF DRAWINGS

Preferred aspects of the disclosure will now be described with reference to the accompanying drawings. Herein.

DETAILED DESCRIPTION

Figure 1:
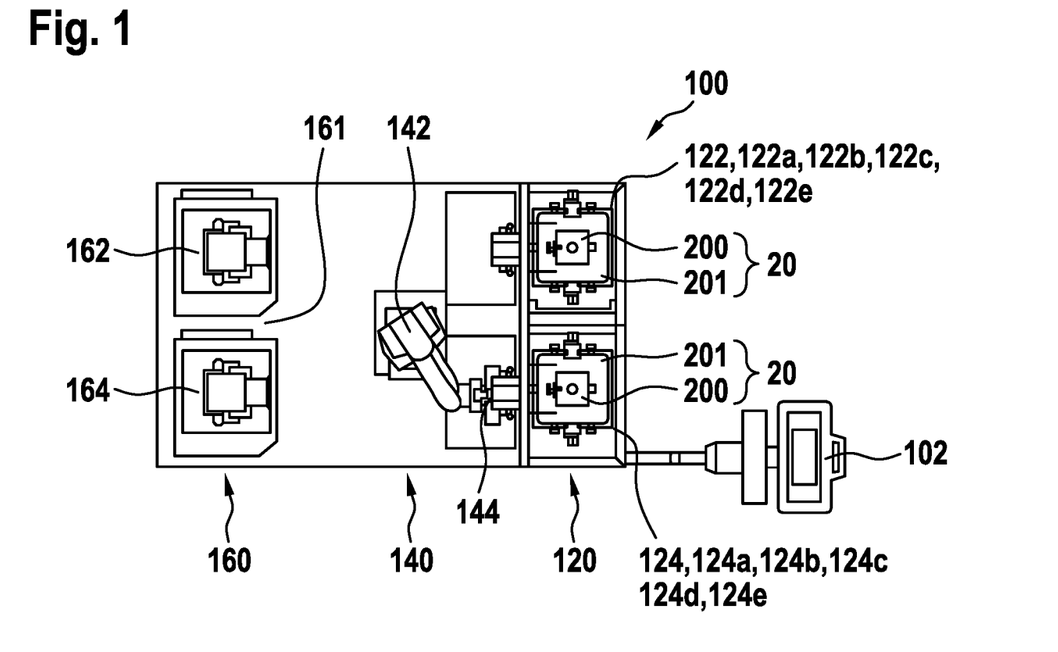
FIG. 1 shows a schematical top sectional view of a preferred aspect of an inspection station according to the disclosure.

Be it assumed that the inspection station constitutes an inspection station for inner pods of EUV pods, EIPs. A further inspection station for EOPs could for example, be arranged next to or above the inspection station 100 for EIPs shown, such that a handling robot 142, the function of which will be further explained below, could be used for both inspection stations. Also, a separate tool adapted for inspection of EOPs, comprising its own load port module, handling module and inspection module could be provided.

Inspection station 100 comprises a load port module 120, a handling module 140 and an inspection module 160. Said modules 120, 140, 160 are controllable by a controller 102.

The load port module 120 comprises two load port units 122, 124. Each load port unit 122, 124 is adapted to receive an EUV pod 20 comprising an EIP 200 within an EOP 201, which comprises two components, namely a base member 202 and a cover member 204 (see also FIGS. 2 and 6). Each load port unit 122, 124 is provided with a schematically indicated opener 122a, 124a. The opener 122a, 122b is adapted to open the EOP 201 in order to access the EIP 200. Typically, the cover member of the EOP will be removed from the base member of the EOP, the EIP remaining on the base member, A schematically indicated identification and weighing unit 122b, 124b is adapted to carry out a first checking of the EIP 200 in order to determine whether the EIP still contains a reticle is provided in each load port unit. This is typically achieved by identifying the type of EIP and the type of base member of the EOP, and then weighing these together. Based on a comparison with standard nominal weights or historical weights of the specific EUV pod components of these items, the presence of a reticle within the EIP can be determined. In cases in which the EIP is provided independently from the base member of the EOP, only the type and weight of the EIP must be taken into consideration.

Also provided in each load port unit 122,124 is a schematically indicated rotary section 122c, 124c for rotating the EUV pod 20, especially the EIP 200, or its parts 202, 204 in order to enable a better handling.

Each load port unit also comprises schematically indicated z-axis displacement unit 122d, 124d for vertically moving the EUV pod 200 or its parts 202, 204 within the load port module 120 in order to enable better handling. For example, the z-axis displacement unit is used to separate the EIP positioned on the base member of the EOP from the cover member of the EOP. Typically, the EOP cover member will be kept in position, while the EOP base member and the EIP positioned thereon are lowered into a position, at which the EIP is opened and separated from the EOP base member.

Furthermore, a schematically indicated ionizer unit 122e, 124e is provided in each load port unit, which is adapted to electrically discharge any electrostatic charge present on the components 202, 204, for example using X-ray ionisation.

Each load port unit 122, 124 is provided with a frame adapted to hold panelling. Especially, the frame and panelling are provided such that any cross contamination between the two load port units 122, 124 is avoided.

The load port module 120 is also provided with a so called light tower comprising a number of indicator lights adapted to indicate the mode of operation of the load port module and emergency switches, so called EMO (Emergency Machine Off) switches, for turning the load port module or the inspection station as a whole off.

Handling module 140, which is arranged adjacent to load port module 120, is provided with a handling robot 142 equipped with a gripper 144. Handling robot 142 and gripper 144 are controlled by controller 102 and/or manually by an operator.

Handling robot 142 and gripper 144 are adapted to grip the components 202 or 204 of the EIP 200, which have been separated in load pod module 120, and transport these to inspection module 160, as will be explained in the following.

Advantageously, handling module 140 is provided with a base frame including wheels, an upper frame and panelling, as well as a filter fan unit or FFU. The filter fan unit is adapted to provide an even, downwardly directed homogeneous airflow within the handling unit 140 as well as within inspection unit 160. As all or most moving parts within the handling module 140 as well as the inspection module 160 are advantageously located below the EIP components being handled and inspected, and particles generated by the moving parts, for example to abrasion effects, will be urged downwardly, i.e. away from the EIP components. Hereby, contamination of the EIP components due to particles within the atmosphere surrounding them can be effectively avoided. It is also conceivable to provide an upward airflow, for example in case the cameras, which are usually positioned vertically above the EIP components being inspected are moved, which potentially might lead to camera-movement related abrasion effects. In case of an upward airflow, contamination of EIP components positioned under the cameras can be minimised or fully avoided.

The handling module 140 is also provided with a parking slot serving as a buffer to buffer store parts of an EIP under certain circumstances, for example to buffer store a cover member in case inspection of a base member requires more time than inspection of this cover member, as a cover member is preferably positioned back on its corresponding base member after inspection.

Handling module 140 is also provided with an ionizer module (not specifically shown) adapted to electrically discharge EIP components, again for example by means of X-ray-ionisation.

Inspection module 160 comprises two inspection units 162, 164. A first inspection unit 162 is provided as a line scan inspection unit, essentially comprising at least one line scan camera 162a, 162b, a bright field or bright light illumination unit 162c, a darkfield illumination unit 162d, and a 4-axis table 162e.

Inspection unit 164 is provided as an area scan inspection unit and comprise corresponding components, i.e. an area scan camera 164a, a bright field or bright light illumination unit 164c, a darkfield illumination unit 164d, and a 3-axis table 164e. This means, that in inspection unit 164 instead of two line scan cameras only one area scan camera 164a, and instead of a 4-axis table 162e a 3-axis table 164e is provided (see especially FIG. 4).

Furthermore, each inspection unit 162, 164 is provided with a base insert and a cover insert, adapted to secure or fasten the corresponding components of the EUV pod, especially the EIP, on the four-axis table 162e or the 3-axis table. It is also possible to provide only one insert, which is adapted to be able to handle both EIP components. Such an insert is schematically shown in FIG. 2 and designated 162f.

Each inspection unit 162, 164 is furthermore provided with a frame and additional brackets and panel sheets adapted to separate the inspection units 162,164 from one another in a manner such that any cross contamination can be avoided. Also, such brackets and panel sheets serve to enable individual settings relating for example to cooling and airflow within the two inspection units.

The inspection units 162, 164 of inspection station 160 will now be described in further detail. As will be explained, both inspection units comprise a number of cameras, either at least one line scan camera or at least one area scan camera. All cameras together, i.e. the cameras of both inspection units, will jointly be referred to as data acquisition unit 161.

Figure 2:
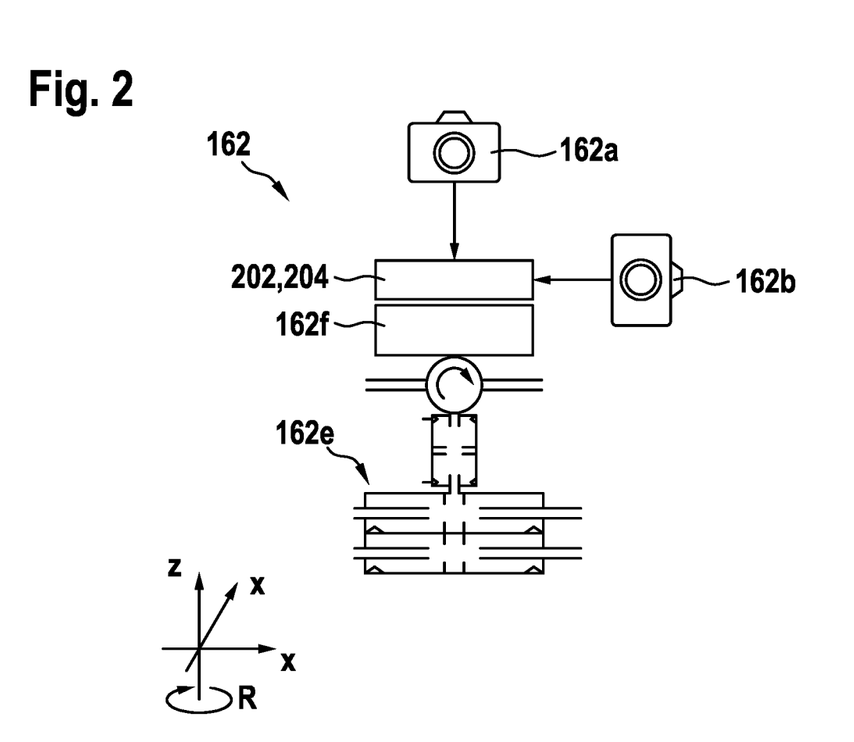
FIG. 2 shows a schematical side view of a first inspection unit of the inspection station using a line scan camera.

FIG. 2 shows a preferred aspect of inspection unit 162 comprising two line scan cameras 162a and 162b. Line scan camera 162a is arranged to provide top views of EIP components 202, 204, i.e. its optical axis extends vertically, or, as defined above, in z-direction, and line scan camera 162b is arranged to provide side views of these EIP components, i.e. its optical axis extends horizontally, or, as defined above, in x- or y-direction.

Figure 3:
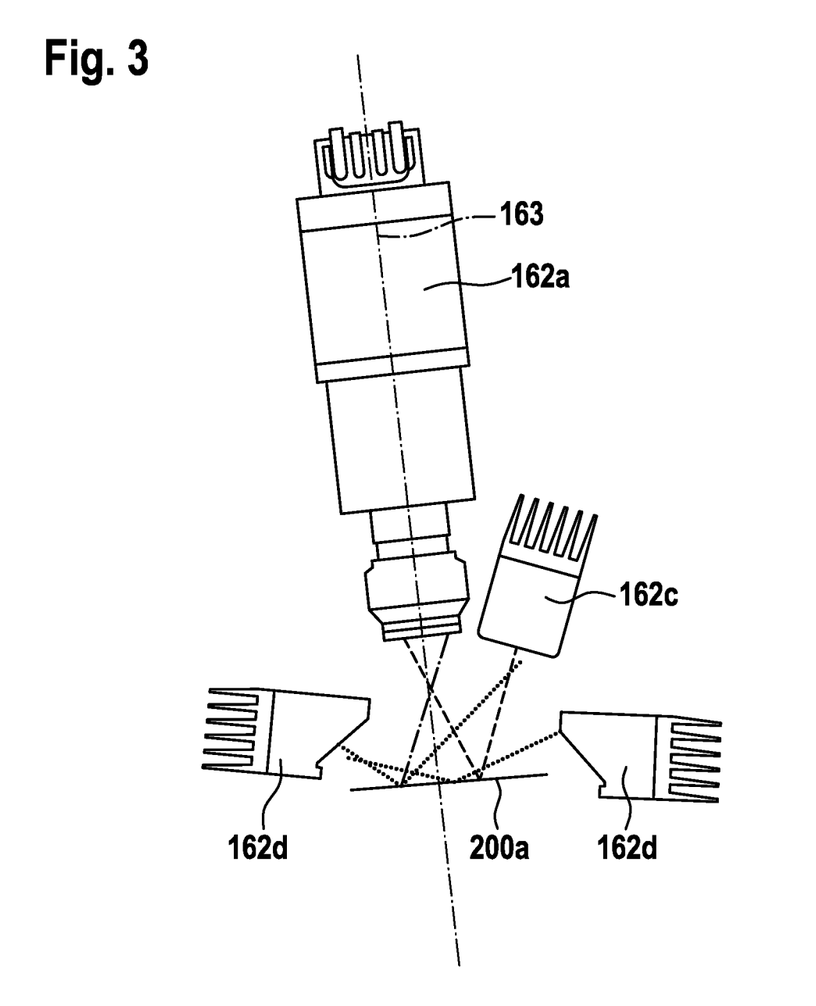
FIG. 3 shows an aspect of the line scan camera used in the first inspection unit.

Line scan cameras 162a, 162b are respectively arranged above and at the side of 4-axis table 162e, which is movable in two linearly independent horizontal directions, designated x-axis and y-axis, and also in a vertical direction, designated z-axis. Furthermore, 4-axis table 162e is rotatable about the z-axis, such that all four sides of the EIP component can be imaged by line scan camera 162b. For ease of reference, a diagram indicating these x-, y- and z-axes as well as the rotation about the z-axis, designated R, is included in FIG. 2. Preferably, line scan cameras 162a,162b are arranged such that their optical axes define an angle of between 5 and 15, preferably 8 to 12, especially 10 degrees relative to a direction normal to the surfaces of the EIP components they are imaging, as indicated in FIG. 3. In FIG. 2, the 4-axis table 162e is provided with a component holder or insert 162f adapted to receive an EIP component 202, 204. Component holder 162f can either be adaptable to different shapes and dimensions of the various EIP components, i.e. base member or cover member, or it can be provided with various inserts adapted to receive and securely hold one of theses components.

As indicated in FIG. 2, an EIP component 202,204, placed on component holder 162f, can be moved to a desired location and orientation relative to line scan cameras 162a, 162b by means of displacement of 4-axis table 162e.

4-axis table 162e enables extremely precise positioning of an EIP component 202,204 relative to the line scan cameras 162a or 162b, which is advantageous due to their small depth of field. Advantageously, EIP component 202, 204 is moved while the line scan cameras remain stationary.

A lighting or illumination system for line scan cameras 162a and 162b will now be further explained with reference to FIG. 3. Here, only line scan camera 162a is shown, but the same lighting system may be used for line scan camera 162b.

Line scan camera 162a is provided with a bright light illumination unit 162c, which shines illumination light of a first wavelength or wavelength spectrum, for example blue light, at essentially a right angle or an angle differing slightly from a right angle to a surface of the EIP component to be inspected (indicated schematically by reference numeral 200a). Light coherently reflected on surface 200a is detected by line scan camera 162a, the optical axis of which is also orientated essentially at a right angle or an angle differing slightly from a right angle to surface 200a. Illumination light emanating from bright light illumination unit 162c and reflected by surface 200a is indicated schematically by dashed lines. The angle defined by the impinging illumination light reflected to line scan camera 162a is typically around 5 to 15, preferably 8 to 12, especially 10 degrees. As can be seen for example in FIG. 3, the angle between the optical axis 163 of line scan camera 162a and the illumination light from unit 162c can be between 0 and 30 degrees, and will preferably be around 20 degrees. Bright light imaging is especially powerful for detecting scratches and defects on a surface.

Furthermore, a darkfield illumination unit 162d is provided, which shines illumination light of a second wavelength or wavelength spectrum, which is different from the first wavelength or wavelength spectrum, for example red light, at very small angles relatively to surface 202a. In case of a defect free surface, this illumination light, indicated by dotted lines in FIG. 3 is coherently reflected at the same small angle, and is not detected by line scan camera 162a. If, however, this darkfield illumination light from illumination unit 162d impinges of a defect, such as a scratch, on surface 200a, it will be scattered, and part of this scattered light will be detected by line scan camera (as indicated by dash-dotted line). Be it noted that a darkfield illumination can be effected from two or more sides, as indicated by two darkfield illumination units 162d as shown in FIG. 3. Hereby, for example blind spots due to pockets on surface 200a, which would not be visible as darkfield images in case of illumination from only one side, can be avoided. Darkfield imaging is especially powerful in detecting particles on a surface.

The line scan cameras 162a and 162b as well as the illumination units can be provided with integrated jigs to adapt their positioning, so that inspection data obtained with different inspection stations can easily be compared to one another, such that the same algorithms and programs can be used for a range of EUV components. Typically, the jig will be provided on a component holder or insert 162f, so that the line scan cameras can be adjusted thereto.

Figure 4:
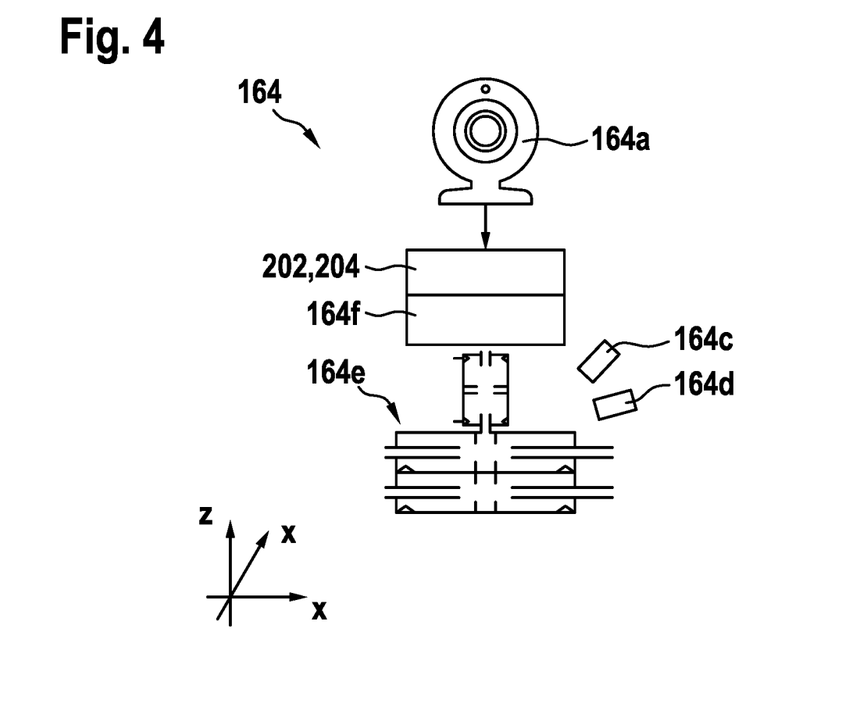
FIG. 4 shows a schematical side view of a second inspection unit using an area scan camera, FIG. 5 a side view of an alternative aspect of a second inspection station, FIG. 6 a top view of an EIP cover as an example of an EIP component having different regions which require different types of inspection, and FIG. 7 a schematical side view of a further preferred aspect of an inspection unit A preferred aspect of an inspection station is shown in a top view in FIG. 1 and generally designated 100.

Referring now to FIG. 4, area scan imaging inspection does not require the same level of accuracy as line scan inspection. According to a preferred aspect of second inspection unit 164, a 3-axis-table 164e similar to 4-axis-table 162e is provided.

Here, only a single area scan camera 164a is provided above the 3-axis-table 164e, also comprising a component holder 164f.

Figure 5:
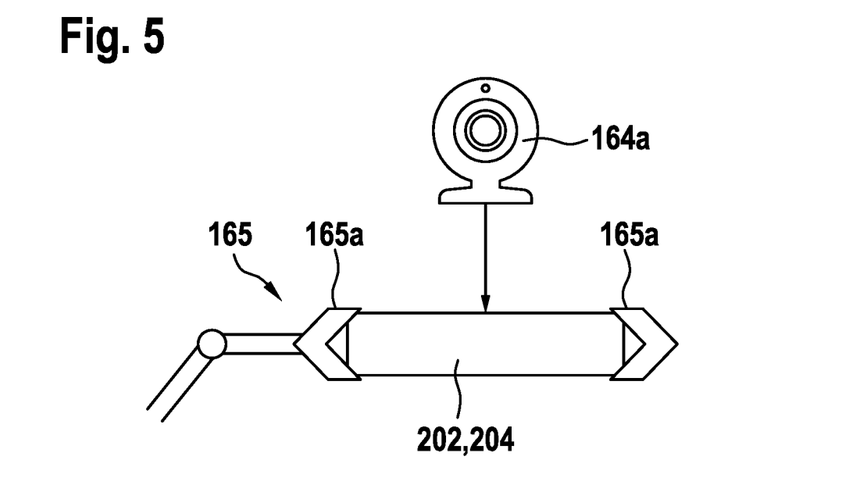

An alternative aspect of second inspection unit 164 is shown in FIG. 5. Here, EIP component 202,204 is held in front of area scan camera 164a by means of a schematically indicated arm 165 of robot, the arm comprising handling flanges 165a. For most applications, the accuracy provided by a robot for positioning and orientating an EIP component relative to an area scan camera and its illumination unit is sufficient.

Figure 6:
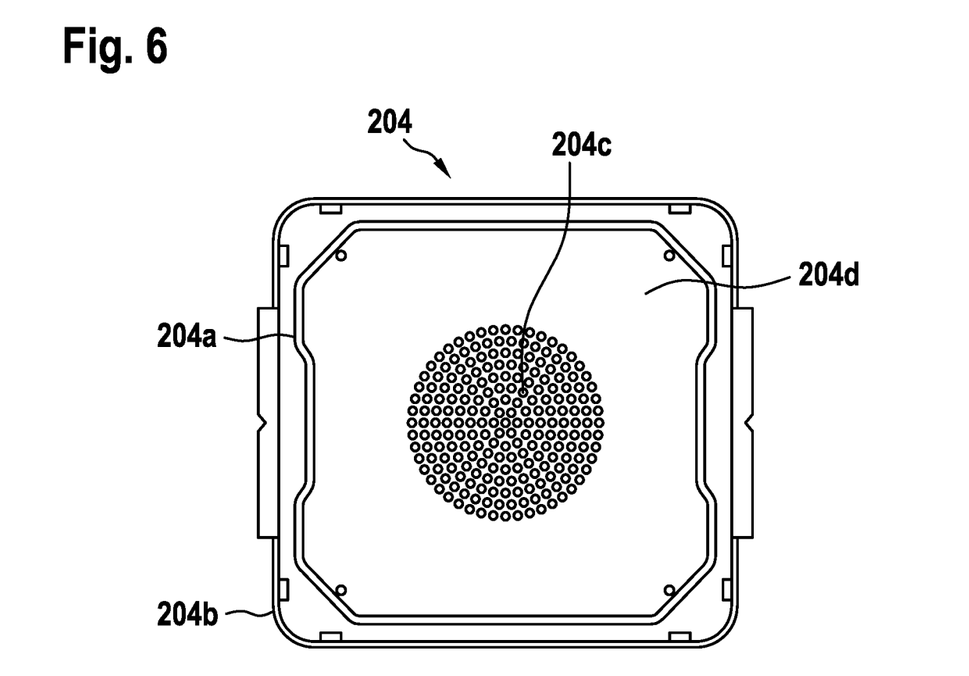

As an example of an EIP component to be inspected as outlined above, FIG. 6 shows a top view of a typical EIP cover member 204. The surface visible in FIG. 6 comprises various regions, for which it is expedient to inspect them using either line scan or area scan imaging. Also, some regions are difficult or even impossible to scan, so that, if expedient, other inspection methods can be employed. By way of illustrative example, region 204a, which constitutes a handling ridge which can be utilised in gripping or positioning the EIP cover member 204, can not readily be scanned in this way. Edge area 204b can be inspected using line scan or area scan imaging, but only provides an inspection of limited quality. Area 204c, comprising filters and/or openings for gas exchange between the inside of the EIP and the volume between the EIP and the EOP is expediently inspected by means of an area scan, and area 204d, which covers the largest part of area cover 204, is expediently inspected by means of line scan.

A particularly advantageous method of monitoring an EUV pod, especially an EIP or an EOP, during its life cycle comprises an initial inspection prior to its first usage in order to obtain first inspection data or a first inspection data set. This first inspection data set can be compared to a standard data set for this specific type of EUV pod. Such a monitoring can also be performed for an EIP or an EOP. At certain intervals, for example after each usage for reticle transportation and/or storage, a further inspection can be performed under identical conditions to acquire subsequent inspection data sets, which can be then compared to the first inspection data set and/or to the standard data set. This method offers a powerful tool of monitoring an EUV pod or its inner or outer pods over time.

Inspection units 162 and 164 are advantageously provided as or in a modular subframe, ie. a subframe in which all parts, especially cameras and illumination units, are fixedly positioned. In this case, only the EIP components to be inspected must be moved during inspection.

The inspection station is advantageously provided with at least one surface particle counter and at least one airborne particle counter. For example, such particle counters can be provided within the load port module 120, the handling module 140 and/or the inspection module 160. Airborne particle counters can also be provided in the environment surrounding the inspection station 100.

Figure 7:
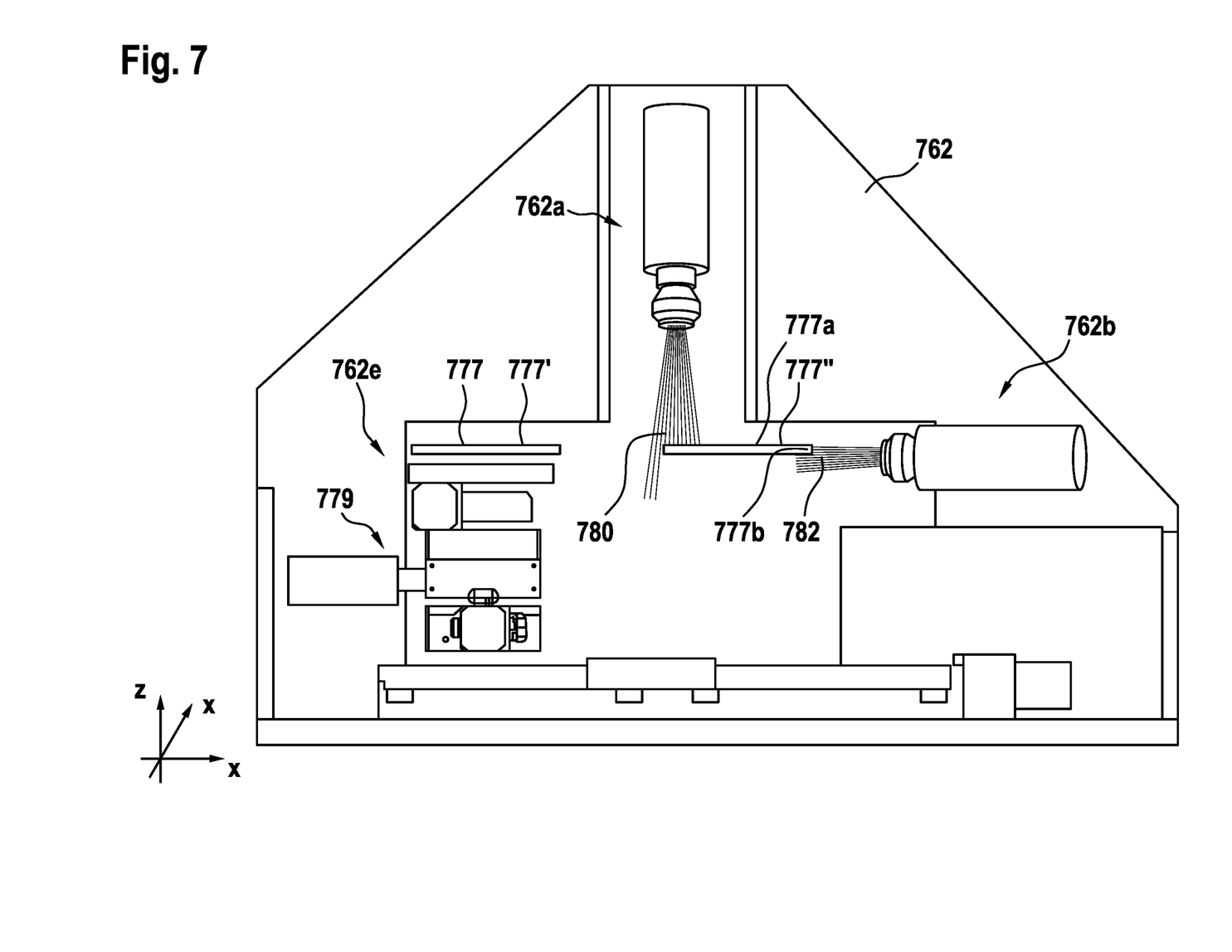

Referring now to FIG. 7, a further aspect of an inspection unit, designated 762, is shown in a side view. Inspection unit 762 comprises a 4-axis table 762e and two line scan cameras 762a, 762b.

4-axis table 762e is provided with a table member 777, which is configured and adapted to receive an insert for holding an EUV component to be inspected. Neither an insert nor an EUV member to be inspected are shown in FIG. 7. The table member 777 is shown in two positions. In the first position, more to the left in FIG. 7, for ease of reference designated 777', it is shown together with a 4-axis mechanism 779, adapted to displace the table member along three mutually perpendicular axes x,y,z, and to rotate it about one of these axes, for example the z-axis.

Table member 777 is also shown in a second position, more to the right in FIG. 7, which, for ease of reference, is designated 777". Be it understood that displacement from the first position 777' to the second position 777" (along the x-axis) is effected by means of mechanism 779. Also in second position 777", it remains connected to mechanism 779, which is, merely in order to simplify representation of table member 777, not shown in this second position 777".

As can be seen in FIG. 7, a scan line (indicated schematically by beam 780) provided by first line scan camera 762a captures an upper or main surface 777a, the captured image preferably comprising an edge or a marking or an image thereon adapted to facilitate focusing, of table member 777. In the case shown in FIG. 7, first line scan camera 762a is provided with a line sensor extending along the x-axis. This means that the line sensor comprises a pixel array including a large number of pixels (typically a few hundred or a few thousand) arranged adjacent to one another along the x-axis, and a small number of pixels (typically one, two of four) arranged adjacent to one another along the y-axis.

In case this scan line 780 is out of focus in z-direction, the table member 777 is then displaced along the z axis, until the upper surface 777a of table member 777 comes into focus. As the depth of focus of such a line scan camera is very small, this position along the z-axis can serve as a very accurate reference position for table member 777 relative to the z-axis. Be it noted that as the focal length of a line scan camera is clearly defined, it might not be necessary to perform this preliminary adjustment of table member 777 along the z-axis, as the exact focal length can be known in advance.

In FIG. 7, scan line 780 crosses the left edge, which extends along the y-axis, of table member 777. Thus, there will be two adjacent pixels in the scan line 780, one of which will capture the edge of the table member in a focused manner, while the neighbouring pixel will capture the surroundings or background of table member 777 in an unfocussed manner. Hereby, the position of the table member in x-direction can be accurately determined, thereby also providing an accurate reference position for line scan camera 762a in x-direction.

When these reference positions relative to the z-axis and x-axis have been determined, the table member 777 is displaced along the x-axis, until a side surface 777b of table member 777 is captured by second line scan camera 762b (scan line schematically indicated by beam 782). In the same manner as described above for the first line scan camera 762a, reference positions relative to the x-axis and the z axis can be accurately determined. As to the reference position in z-direction, be it noted that scan line 782 of second line scan camera 762b extends essentially in z-direction, and crosses the lower edge of table member 777.

In order to further enhance accuracy of these reference positions, the upper surface 777a and the side surface 777b can be provided with markings, which the respective line scan cameras can capture. Bringing such markings into focus of a line scan camera may serve to accelerate the determining of reference positions, as such markings are easier to focus on than for example essentially homogenous and monochrome surfaces.

Be it noted that in the arrangement of line scan cameras and scan lines shown in FIG. 7, both scan lines can provide information relating to the positioning of the table member in x- and z-direction. For some applications, this is sufficient. Alternatively or additionally, providing corresponding information relating to the y-axis could, for example, be achieved by positioning second line scan camera 762b (or a third line scan camera) such that its optical axis extends along the y-axis, and maintaining its direction of extension of the line sensor along the z-axis.

Once such reference positions for table member 777 have been determined, inspection of EUV components positioned on table member 777 is greatly simplified, as different inspection units, the components of which are subject to relatively large tolerances, can be calibrated relative to one another. As, for example, the thickness of an EIP cover is known, and has only very small tolerances, the surface of an EIP can be brought into the depth of focus region of a line scan camera with great accuracy. This simplifies for example comparison of one and the same EIP cover at different times of its life cycle, as typically different inspections at different times will be performed by different inspection units.

What is claimed is:

1. A Method for inspection of an inner pod EIP and/or an outer pod EOP of an EUV pod, respectively including a base member and a cover member, the method comprising acquiring inspection data using at least one line scan camera and at least one area scan camera, characterized by the following steps:
   A. Inspecting the cover member in a first inspection unit using the at least one line scan camera,
   B. Inspecting the base member in a second inspection unit using the at least one area scan camera,
   C. Inspecting the cover member in the second inspection unit using the at least one area scan camera, and
   D. Inspecting the base member in the first inspection unit using the at least one line scan camera.

2. The method according to claim 1, steps A and B being performed at least in part simultaneously, followed by steps C and D being performed at least in part simultaneously, or steps C and D being performed at least in part simultaneously, followed by steps A and B being performed at least in part simultaneously.

3. The method according to claim 1, steps A and D comprising positioning and/or moving the cover member and the base member respectively by means of a 3-axis- or 4-axis-table.

4. The method according to claim 1, steps B and C comprising positioning and/or moving the base member and the cover member respectively by means of a 3-axis- or a 4-axis-table or by means of a handling robot.

5. The method according to claim 1, wherein using the at least one line scan camera and/or using the at least one area scan camera comprises darkfield imaging and bright light imaging.

6. The method according to claim 5, wherein the darkfield imaging and the bright light imaging is performed simultaneously by means of the at least one line scan camera and/or the at least one area scan camera, the darkfield imaging utilising illumination at a first wavelength and the bright light imaging utilising illumination at a second wavelength different from the first wavelength.

7. The method according to claim 1, comprising a weight measurement of the EIP or the EOP prior to steps A to D, and/or
   comprising a surface particle counting adapted to count particles on a surface of the cover member and/or the base member, and/or
   comprising counting airborne particles within an atmosphere around the cover member and/or the base member.

8. The method according to claim 1, wherein inspection data are acquired at different times, especially after each usage cycle of an EUV pod, these inspection data being compared to one another and/or to standard data.

9. The method according to claim 1, wherein steps A and D comprise inspecting the cover member and the base member using a plurality of line scan cameras respectively configured and adapted to capture scan lines on different surfaces of the cover member or the base member wherein for inspection the cover member or the base member respectively is placed on a table member of a 3-axis or 4-axis table, for which at least one reference position relative to a corresponding one of the plurality of line scan cameras has been determined as follows:
   capturing a scan line on at least one surface by means of a respective one of the plurality of line scan cameras,
   in case the scan line captured by the line scan camera is not in focus, moving the table member relative to the line scan camera such that the scan line comes into focus
   determining the position of the table member, at which the scan line is in focus, as a reference position of the table member relative the line scan camera on an axis extending parallel to an optical axis of the line scan camera and/or on an axis extending parallel to the scan line.

10. An inspection station adapted for inspection of an inner pod EIP and/or an outer pod EOP of an EUV pod, respectively comprising a base member and a cover member, the inspection station comprising an inspection module with at least two inspection units and an image data acquisition unit for acquiring EUV pod inspection data sets, the data acquisition unit comprising at least one line scan camera and at least one area scan camera, characterized in that the image data acquisition unit is adapted to:

inspect the cover member in the first inspection unit using the at least one line scan camera,
   inspect the base member in the second inspection unit using the at least one area scan camera,
   inspect the cover member in the second inspection unit using the at least one area scan camera, and
   inspect the base member in the first inspection unit using the at least one line scan camera.

11. The inspection station unit according to claim 10, at least one inspection unit comprising a 3-axis- or a 4-axis table adapted to position and move the base member and/or the cover member relative to the data acquisition unit.

12. The inspection station according to claim 11, further comprising a load port module adapted to receive an inner pod EIP and/or an outer pod EOP of an EUV pod, and separate the base member from the cover member of the EIP and/or the EOP, the load port module especially being provided with an identification and weighing unit adapted to determine whether an EUV pod, especially an EIP, is empty or not after it is introduced into the load port module.

13. The inspection station according to claim 11, comprising a handling module comprising a handling robot adapted to transfer the cover member and the base member from the load port module to the inspection module.

14. The inspection station according to claim 11, wherein the at least one line scan camera and/or the at least one area scan camera is provided with bright light and darkfield illumination means adapted to enable simultaneous bright light and darkfield imaging of a cover member or a base member.

15. A method of determining a reference position of a table member of a 3-axis or a 4-axis table relative to at least one of a plurality of line scan cameras, comprising the following steps:

capturing a scan line on at least one surface of the table member by means of a respective one of the plurality of line scan cameras,
   in case the scan line captured by the line scan camera is not in focus, moving the table member relative to the line scan camera such that the scan line comes into focus,
   determining the position of the table member, at which the scan line is in focus, as reference position of the table member relative the line scan camera on an axis extending parallel to an optical axis of the line scan camera and/or on an axis extending parallel to the scan line.

* * * * *